United States Patent [19]

Komeyama et al.

[11] Patent Number: 4,708,484
[45] Date of Patent: Nov. 24, 1987

[54] PROJECTION ALIGNMENT METHOD AND APPARATUS

[75] Inventors: Yoshihiro Komeyama; Yukio Kembo, both of Yokohama; Asahiro Kuni, Tokyo; Ryuuichi Funatsu, Yokohama; Akira Inagaki, Yokohama; Minoru Ikeda, Yokohama; Keiichi Okamoto, Yokohama, all of Japan

[73] Assignee: Hitachi, Ltd., Tokyo, Japan

[21] Appl. No.: 789,778

[22] Filed: Oct. 21, 1985

[30] Foreign Application Priority Data

Oct. 24, 1984 [JP] Japan .................... 59-222009
Feb. 22, 1985 [JP] Japan .................... 60-32874
Apr. 12, 1985 [JP] Japan .................... 60-76384

[51] Int. Cl.$^4$ .................................... G01B 11/26
[52] U.S. Cl. ............................ 356/401; 356/152
[58] Field of Search ............... 356/150, 152, 375, 400, 356/401; 250/561

[56] References Cited

U.S. PATENT DOCUMENTS 4,558,949 12/1985 Uehara et al. .............. 356/400 X
4,614,431 9/1986 Komeyama .................. 356/401
4,616,130 10/1986 Omata ....................... 356/401 X Primary Examiner—Eugene R. LaRoche
Assistant Examiner—Robert J. Pascal
Attorney, Agent, or Firm—Antonelli, Terry & Wands

[57] ABSTRACT

The present invention relates, in a projection aligner wherein a mask and a wafer are held proximate to one another and wherein a circuit pattern depicted on the mask is transferred onto the wafer, to a method of detecting the respective positions of the mask and the wafer for the relative positioning between the mask and the wafer. To the end of dispensing with the withdrawal of a microscope objective in such a way that the objective of a microscope for detecting the mask and the wafer and projection light, for example, an X-ray, are prevented from interfering, thereby to achieve the enhancement of throughput and to permit the detection of the positions of the mask and the wafer even during projection, the present invention consists in that the objective of the microscope is inclined with respect to a perpendicular to the plane of the mask or the plane of the wafer being a plane to-be-detected, so as not to interfere with the projection light, for example, the X-ray, whereby the circuit pattern can be transferred while the relative positions of the mask and the wafer are being detected.

7 Claims, 35 Drawing Figures

PROJECTION ALIGNMENT METHOD AND APPARATUS

BACKGROUND OF THE INVENTION

The present invention relates, in a projection aligner wherein a mask and a wafer are held proximate to one another and wherein a circuit pattern depicted on the mask is transferred onto the wafer, to a method of detecting the respective positions of the mask and the wafer for the relative positioning between the mask and the wafer.

Heretofore, in the relative positioning between a mask and a wafer, positioning marks have been detected by a microscope as described in, for example, Japanese Patent Application Laid-open No. 57-4291. With such a system, however, the objective of the microscope is upright over the planes of the mask and the wafer, so that an optical system for the positioning mark detection and projection light, for example, an X-ray interfere in case of transferring the circuit pattern of the mask onto the wafer through projection. For this reason, the objective of the microscope needs to be withdrawn from an optical system for the projection during the transfer of the circuit pattern. The withdrawal requires a long time, and has led to the problem that the throughput lowers.

For example, regarding present-day LSI's, as the stripe width thereof is becoming 1 $\mu$m or less, an X-ray aligner which is a typical proximity aligner is directed to a stripe width of or below 0.8 $\mu$m. Therefore, an alignment precision within 0.3 $\mu$m has been required.

As methods of realizing alignment detection, there are a method wherein alignment patterns are magnified and detected, a method wherein a laser is scanned, a method wherein a position is magnified by the use of a diffraction grating, etc.

With the method which magnifies and detects the alignment patterns, the alignment patterns of a mask and a wafer are magnified and detected by an objective, and they are focused on an imaging device so as to perform alignment through signal processing. Therefore, in order to attain the aforementioned alignment precision within 0.3 $\mu$m, the precision of the alignment detection itself needs to be a high precision within 0.1 $\mu$m because the mechanical errors of the aligner and the dimensional errors of the mask and wafer themselves are involved besides the alignment detection precision.

In this regard, there has hitherto been invented, for example, a measure wherein as described in the official gazette of Japanese Patent Application Publication No. 57-42971, an objective of small focal depth is used thereby to enlarge the aperture of the lens and to take a larger quantity of light, making it possible to image patterns of inferior contrast.

In the case of using the objective of small focal depth as described above, however, when it is intended to obtain a pattern image of high precision, the magnifying power of the lens becomes 40–60 magnifications and the NA (Numerical Aperture) becomes 0.5 or more, and also the aperture enlarges and the working distance is small. Accordingly, when the alignment patterns lie in a projection region, the objective might interfere with an X-ray for projection.

Therefore, an objective set needs to be withdrawn at each projecting operation, resulting in the problems that a high throughput is hampered and that the alignment patterns cannot be detected during the projection.

In still another prior-art example illustrative of a method and apparatus for positioning a mask and a wafer, Fresnel zone marks provided on the mask and the wafer are obliquely illuminated from outside a projection region toward the projection region, and hence, coherent light diffracted to Fresnel zones is focused in the projection region. Therefore, an objective for detecting the focused position is inevitably arranged in the projection region. Accordingly, after the focus in the Fresnel zones has been detected by the objective and the wafer and mask have been aligned, the objective must be withdrawn. Since the projection in the prior art employs a system of exposing the whole surface of the wafer to projection light collectively, one alignment operation suffices for one wafer, so that a somewhat long time required has not been a problem. Pertinent to the positioning method of this type is, for example, Japanese Patent Application Laid-open No. 56-157033.

With a step-and-repeat system aimed at the transfer of ultrafine patterns of 1 $\mu$m or less, however, ten odd times of alignment and projection operations are repeated per wafer, and hence, it is an important theme to shorten the alignment period of time.

Another problem is that, since the objective is moved after the alignment between the mask and the wafer, the vibrations thereof degrade the alignment precision of the mask and the wafer.

SUMMARY OF THE INVENTION

An object of the present invention is to dispense with the withdrawal of a microscope objective in such a way that the objective of a microscope for detecting a mask and a wafer and projection light, for example, an X-ray are prevented from interfering, thereby to achieve the enhancement of throughput and to permit the detection of the positions of the mask and the wafer even during projection.

In order to accomplish the object, according to the present invention, the objective of a microscope is inclined with respect to a perpendicular to the plane of a mask or the plane of a wafer being a plane to-be-detected, so as not to interfere with projection light, for example, an X-ray, whereby transfer is permitted to be done while the relative positions of the mask and the wafer are being detected.

Further, when the objective of the microscope is inclined with respect to the perpendicular to the mask plane or the wafer plane being the plane to-be-detected as described above, the detecting plane of the objective of the microscope does not orthogonally intersect a detecting optic axis, so that when the plane is detected by the microscope objective, the focusing plane thereof inclines with respect to the optic axis more greatly. In consequence, even when a photosensor for detecting positions is placed orthogonally to the optic axis, the focusing part thereof is extremely limited, and hence, required positional information is not obtained sufficiently. For this reason, a diffraction grating having a grating surface of predetermined shape is arranged in substantial agreement with the focusing plane which inclines with respect to the optic axis. When light reflected from the plane of the diffraction grating substantially perpendicularly is focused again by the objective of a second microscope, the focusing plane of this objective intersects the optic axis substantially orthogonally. By arranging the photosensor at this focusing plane, the positions of the mask and the wafer are detected.

In addition, the present invention is characterized in that a magnifying optical system is constructed of an objective of small NA. The objective of small NA affords a long working distance and a great focal depth. Even in detecting patterns within or near a projection region, therefore, the objective can detect the alignment patterns while inclining so as not to interfere with projection light. Since, however, a single optic axis can detect a position in only one direction (a direction orthogonal to the detecting optic axis on the planes of a wafer and a mask), three optic axes are needed for the detection of three degrees of freedom (X, Y, $\theta$) by way of example.

Further, according to the present invention, Fresnel zone marks provided on a mask and a wafer are illuminated obliquely from within a projection region toward the exterior of the projection region with coherent light (He-Ne laser) so that the focus of diffracted light from the Fresnel zone marks may be formed outside the projection region.

Besides, to the end of simultaneously detecting the focuses of the wafer and the mask by means of an objective which is inclined from a perpendicular to mask and wafer planes and has its optic axis brought into agreement with the traveling direction of the diffracted light in order to detect the focus of the diffracted light, the focal positions of the wafer and the mask are focused on a plane perpendicular to the optic axis of the inclined objective.

Besides, the shape of unidimensional Fresnel zones arranged on a wafer or mask surface is tapered, and the focal plane thereof is formed on a plane perpendicular to an objective so as to prevent defocusing at detection.

BRIEF DESCRIPTION OF THE DRAWINGS

FIG. 4b is an arrangement view showing the arrangement of the mask alignment apparatus shown in FIG. 4a;

DESCRIPTION OF THE PREFERRED EMBODIMENTS

A first embodiment of the present invention will be described with reference to FIGS. 1–3.

Figure 1:
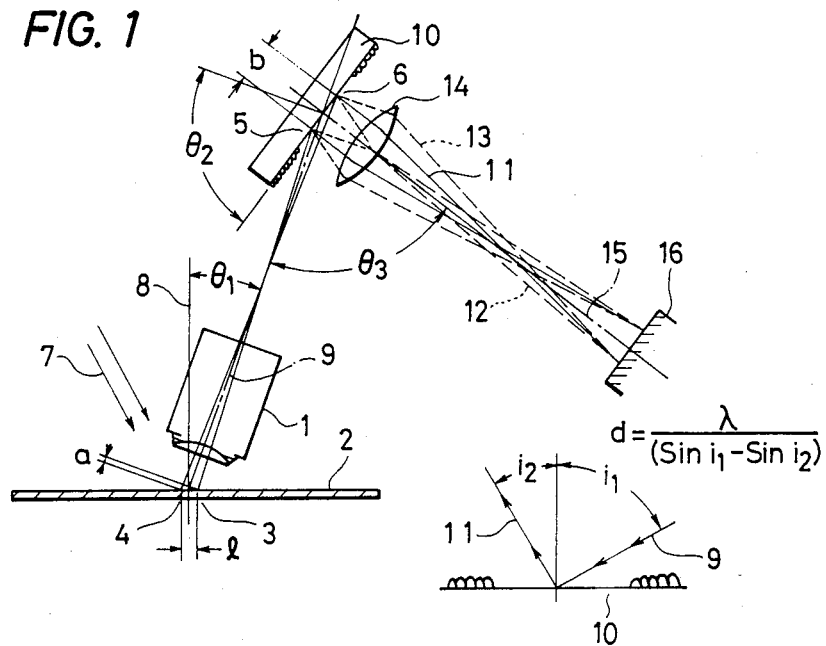
FIG. 1 is a schematic diagram for explaining the principle of a first embodiment of the present invention and shows the situation of the change of the inclination angle of a focusing plane by a diffraction grating.

FIG. 1 illustrates a principle on the basis of which an image plane focused obliquely with respect to a plane orthogonal to an optic axis is changed by a diffraction grating so as to be focused on the orthogonal plane of the optic axis.

When the optic axis 9 of a microscope objective 1 of about 10 magnifications is inclined by $\theta_1$ (approximately 20°) from a perpendicular 8 to a plane to-be-detected 2, the difference a between the distances from the microscope objective 1, of a point-A 3 and a point-B 4 spaced by l can be expressed by $l \times \sin \theta_1$. In addition, when the point-A 3 and the point-B 4 are obliquely illuminated as indicated at 7 (a light source is omitted from the illustration) and are detected by the microscope objective 1, the point-A 3 is focused as a point-A′ 6 and the point-B 4 as a point-B′ 5. A focusing plane with the point-A′ 5 and the point-B′ 6 connected becomes $\theta_2$ (approximately 74°) to a perpendicular to the optic axis 9. In this regard, when a diffraction grating 10 whose grating has a pitch d expressed by the following formula is arranged in substantial agreement with the focusing plane, primary reflected light of wavelength $\lambda$ becomes substantially orthogonal to the diffraction grating:

$$d = \lambda/(\sin i_1 - \sin i_2)$$

$\lambda$: wavelength
$i_1$: angle of incidence ($\theta_3$)
$i_2$: angle of relfection (0°)

Besides, light whose wavelength is somewhat longer that $\lambda$ is relfected as a light ray 12, and light whose wavelength is somewhat shorter than $\lambda$ is reflected as a light ray 13. These reflected light rays are focused on a photosensor 16 by a second objective 14 again, whereby the plane of the focused image can intersect an optic axis 15 substantially orthogonally.

Thus, the position of the object to-be-measured can be exactly detected.

Figure 2:
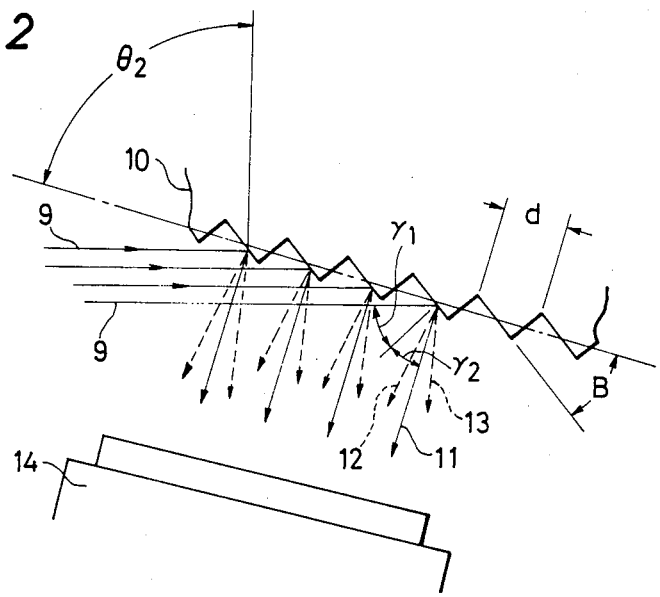
FIG. 2 is an explanatory diagram showing the state of the optical system of the reflective surface of the diffraction grating shown in FIG. 1.

FIG. 2 shows the details of the plane of the diffraction grating 10. The surface of the diffraction grating is formed with a blaze angle B, and incident light 9 and reflected light 11 have their angle of incidence $\gamma_1$ and angle of reflection $\gamma_2$ equalized with respect to the blaze angle B, so that an enhanced efficiency is achieved.

Figure 3:
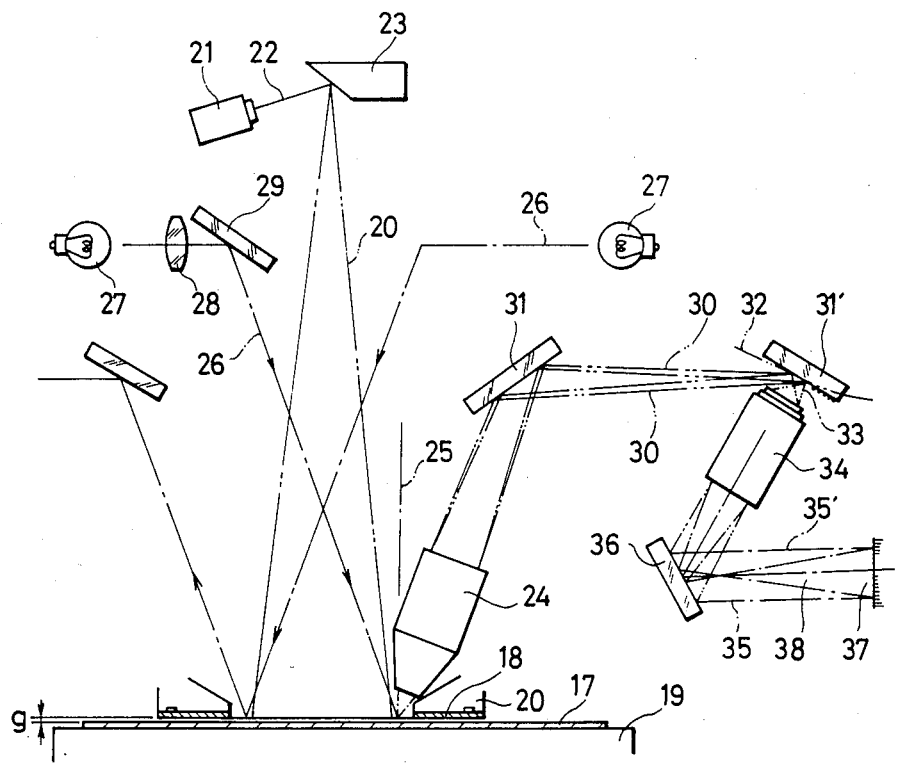
FIG. 3 is a schematic diagram of an X-ray projection aligner to which the system of the present invention shown in FIG. 1 is applied.

FIG. 3 shows an example in which the present invention is applied to an X-ray projection aligner. A mask 18 and a wafer 17 are proximate to one another with a minute gap (g=10-40 $\mu$m), and the wafer 17 is drawn to a wafer chuck 19 by suction. The wafer chuck is freely movable in directions X, Y and $\theta$ owing to X, Y and $\theta$ stages. In addition, the mask 18 is drawn to a mask chuck 20 by suction, and the mask chuck 20 can freely move vertically.

An X-ray 20', which is projection light for transferring the circuit pattern of the mask 18 onto the wafer 17, is produced in such a way that an electron beam 22 from an electron gun 21 heats an X-ray source 23. The X-ray 20' produced from the X-ray source 23 spreads fanwise and irradiates the surface of the mask 18, thereby to transfer the circuit pattern of the mask 18 onto the wafer 17.

In detecting the positions of the mask 18 and the wafer 17, a microscope objective 24 is inclined with respect to a perpendicular 25 to the mask 18 or the wafer 17 lest the above X-ray 20' should interfere with the microscope objective 24. Illumination light 26 from a light source 27 is condensed by a condenser 28, and falls on a mirror 29 to illuminate the mask 18 and the wafer 17 in a direction which inclines in a sense opposite to, and by an angle equal to, those of the microscope objective 24. Detection light 30 having detected the positions of the mask 18 and the wafer 17 by means of the microscope objective 24 is deflected by a mirror 31, to be focused on a plane 32 which is substantially in agreement with a diffraction grating plane 31'. As stated before, primary reflected light 33 from the diffraction grating proceeds from the diffraction grating plane substantially orthogonally. The primary reflected light 33 is detected by a second objective 34, and the resulting detection light rays 35 and 35' are deflected by a mirror 36 and are thereafter focused on the plane of a photosensor 37. Since the detection light rays 35 and 35' are focused orthogonally to an optic axis 38 as shown in the figure, the positions of the mask 18 and the wafer 17 can be exactly detected.

According to the present invention, a microscope objective for detecting positions need not be withdrawn out of a projecting optical system during projection. Therefore, it has of course become possible to achieve the enhancement of throughput. Moreover, since the positions of a mask and a wafer can be detected even in the course of projection, projection based on positioning of higher accuracy has become possible.

Now, a second embodiment according to the present invention will be described. First, a lens of low resolving power will be studied. According to Rayleigh's equation, the NA and the performance of the lens are as follows:

$$\text{Resolution } R = 0.61 \cdot \lambda \cdot \sqrt{\frac{1}{NA^2} - 1} \quad (1)$$

$$\text{Focal depth } |Z| \leq \frac{\lambda}{2}\left(\frac{1}{NA^2} - 1\right) \quad (2)$$

where $\lambda$ denotes a wavelength used.

In addition, as the NA is smaller, the working distance increases more. When Equations (1) and (2) are calculated for NA's of 0.25 and 0.5 by way of example, the results become as in Table 1:

TABLE 1

| NA | Resolution | Focal Depth | Working Distance |
|---|---|---|---|
| 0.25 | 0.6 $\mu$m | ±4.5 $\mu$m | 20 mm |
| 0.5 | 1.4 $\mu$m | ±0.9 $\mu$m | 5 mm |

$\lambda = 0.6$ $\mu$m is supposed.

As apparent from Table 1 and Equations (1) and (2) mentioned above, when the NA is small, the resolution lowers, but design factors such as the focal depth and the working distance are greatly enhanced. In the present embodiment, therefore, a magnifying optical system is constructed by the use of an objective of small NA.

Figure 4A:
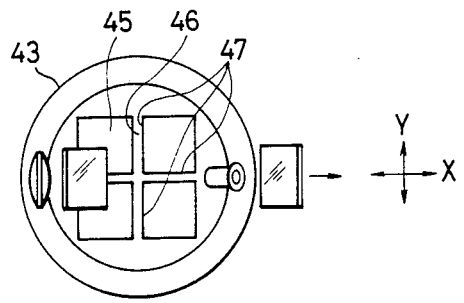
FIG. 4a is a plan view showing a mask alignment apparatus to which a second embodiment of the present invention is applied.
Figure 4B:
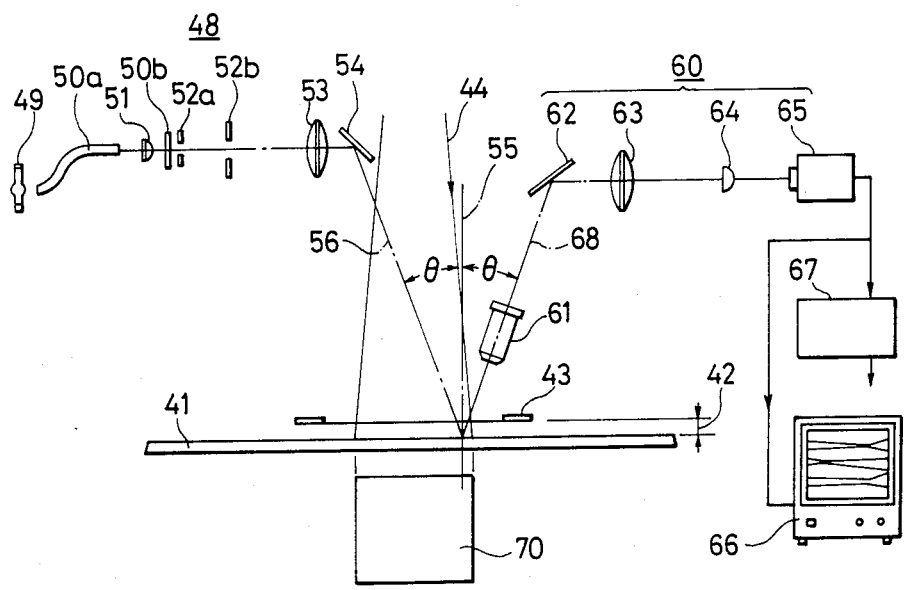

Referring to FIGS. 4a thru 11c, the invention will be concretely described below. FIG. 4a is a plan view of a mask alignment apparatus showing the second embodiment of the present invention, while FIG. 4b is a front view showing the schematic arrangement thereof. In the figures, numeral 41 designates a wafer, the upper surface of which is formed with a wafer pattern (not shown). Numeral 43 designates a mask which is made of a transparent plate and which is arranged in parallel with the wafer 41 while defining a gap 42 of, for example, 10 $\mu$m. The upper surface of the mask is formed with three alignment patterns 47 on streets 46 in a chip 45, while the lower surface thereof is formed with a mask pattern (not shown) at a position corresponding to the aforementioned wafer pattern. Numeral 44 indicates an X-ray for projection, which is radiated from an X-ray source disposed at a position, not shown, over the mask 43 and which prints the mask pattern on the wafer 41 with a size of, for example, 30 mm square. Numeral 48 indicates three sets of illuminating optical systems (only one set is illustrated), in each of which white illumination light is led from a light source 49 through a fiber 50a, a lens 51, a fiber 50b, irises 52a and 52b, and a lens 53, and a mirror 54 arranged outside the projecting X-ray 44 on an illuminating optic axis 56 inclining at an angle $\theta$ of 20° with respect to a plane orthogonal to an alignment direction (a direction indicated by an arrow Y), namely, with respect to a vertical line 55 and throws the illumination light onto the wafer pattern 58 and the mask pattern 59 (refer also to FIG. 5a). Numeral 60 indicates three sets of detecting optical systems (only one set is illustrated), each of which is formed of an objective 61, a mirror 62, a focusing lens 63, a cylindrical lens 64, a TV camera 65, a monitor TV 66, and a processing circuit 67. The objective 61 is arranged outside the projecting X-ray 44 on a detecting optic axis 68 which inclines at the same angle $\theta$=20° as that of the illuminating optic axis 56 with respect to the vertical line 55. As seen from FIG. 5a showing a section of the portion for detecting the wafer pattern 58 of the wafer 41 and the mask pattern 59 of the mask 43, that a plane orthogonal to the detecting optic axis 68 which passes through the central position O on the vertical line 55 between the wafer pattern 58 and the mask pattern 59 is superposed on a visionary focal plane 69. Then, the extent between the intersection point MF of this visionary focal plane 69 and the mask pattern 59 and the intersection point WF of the same plane and the wafer pattern 58 becomes a focusing range L. As seen from FIG. 5b showing a picture imaged on the monitor TV 66, the mask pattern 59 centrally located in a widthwise direction is most focused at the intersection point MF on the left side in the figure and is more defocused in a lengthwise direction on both the sides thereof, while the two wafer patterns 58 located above and below the mask pattern 59 are most focused at the intersection point WF on the right side in the figure and are more defocused in the lengthwise direction on both the sides thereof. When calculated from the results of Table 1 mentioned before, the range L of both the intersection points MF and WF becomes 26.3 μm in terms of the field of view. The reason why the focusing range L can be enlarged in this manner, is that the NA of the objective 61 is made small. The cylindrical lens 64 compresses an image focused by the focusing lens 63, in the lengthwise direction, and the compressed image is picked up by the TV camera 65.

Figure 5A:
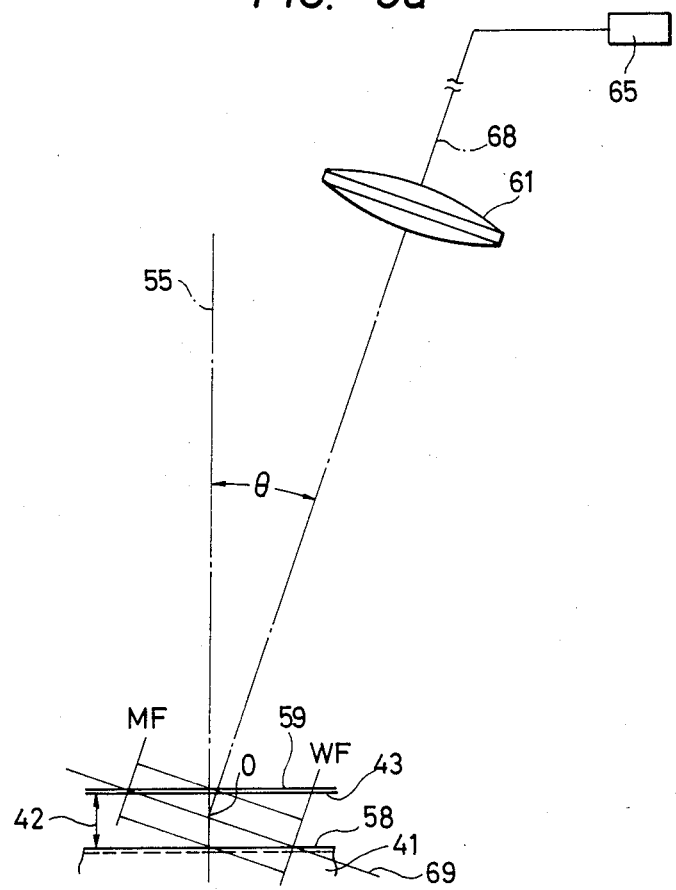
FIG. 5a is an explanatory diagram showing a section of a portion for detecting wafer alignment and mask alignment patterns.
Figure 5B:
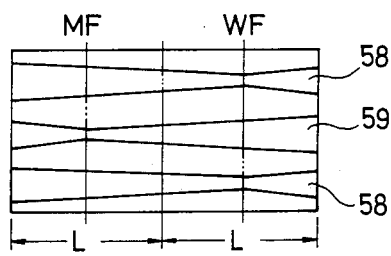
FIG. 5b is an explanatory diagram showing the detected images of the wafer alignment and mask alignment patterns.
Figure 6:
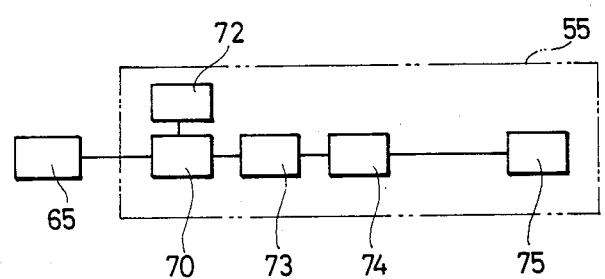
FIG. 6 is a circuit arrangement diagram showing a processing circuit in the second embodiment of the present invention.
Figure 7A:
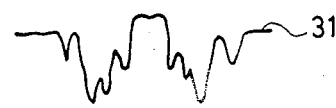
FIG. 7a is a diagram showing a video signal waveform produced by a TV camera.
Figure 7B:
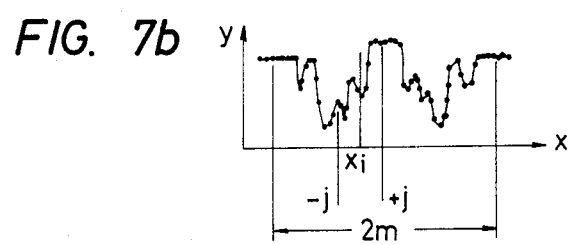
FIG. 7b is a diagram showing a state sampled and held by a sample-and-hold circuit.
Figure 7C:
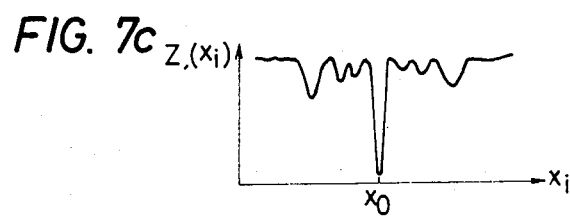
FIG. 7c is a diagram showing the values of a symmetry function $Z_1$ obtained by an arithmetic circuit.
Figure 8:
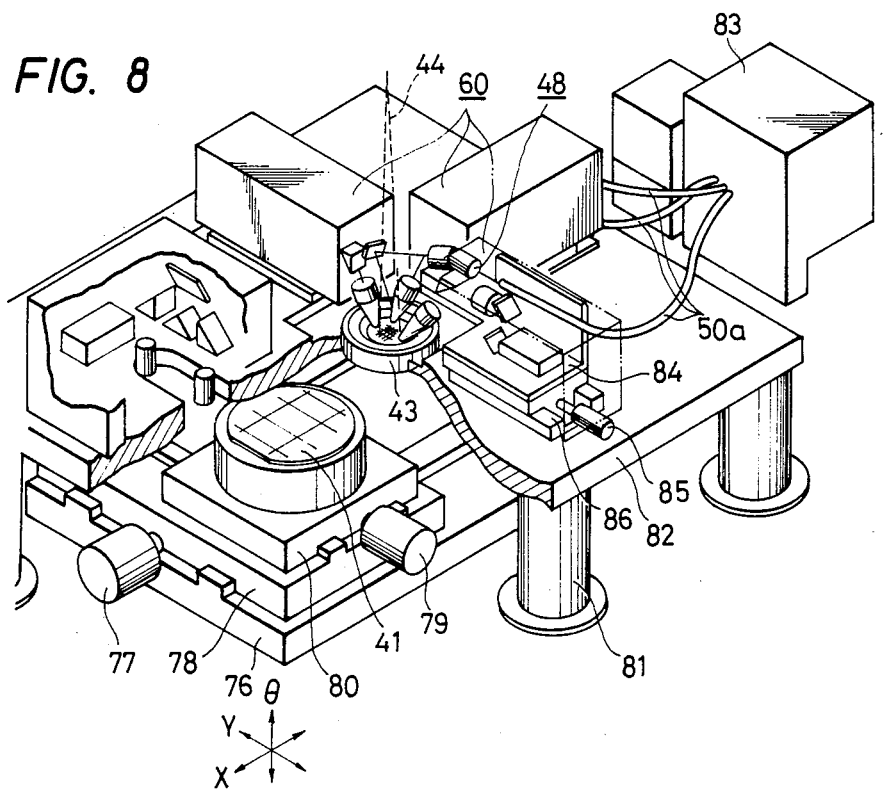
FIG. 8 is a perspective view showing an apparatus for relatively detecting a plurality of objects illustrative of the second embodiment of the present invention.
Figure 9:
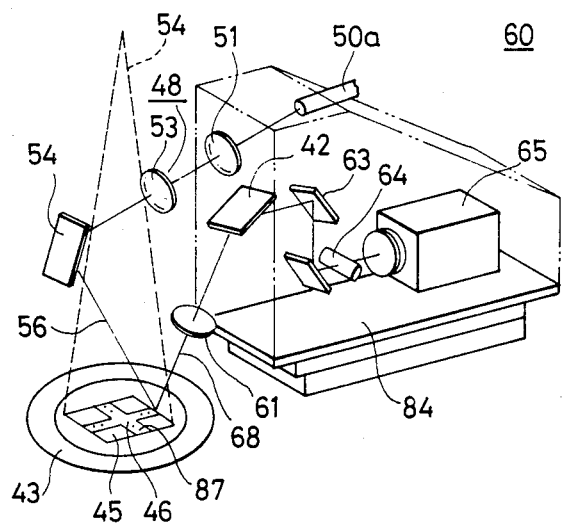
FIG. 9 is a constructional view for explaining an illuminating optical system and a detecting optical system in the relative detection apparatus shown in FIG. 8.
Figure 10A:
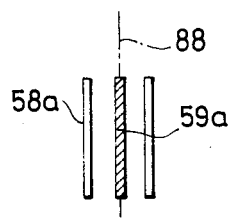
FIGS. 10a–10f are diagrams showing detection patterns.
Figure 10B:
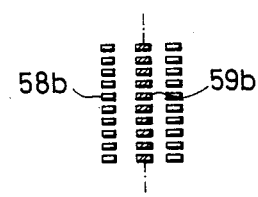
Figure 10C:
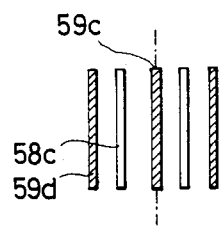
Figure 10D:
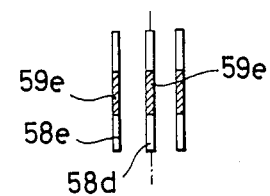
Figure 10E:
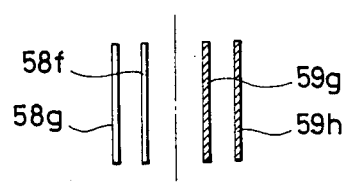
Figure 10F:
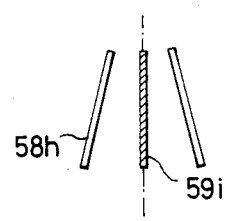
Figure 11A:
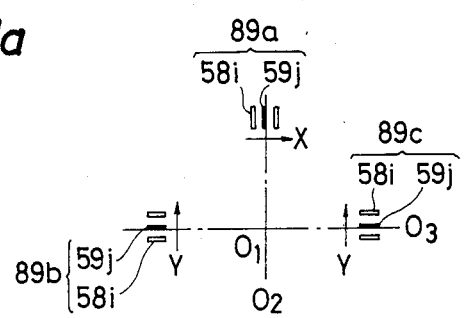
FIGS. 11a–11c are diagrams showing the detecting directions of alignment patterns.
Figure 11B:
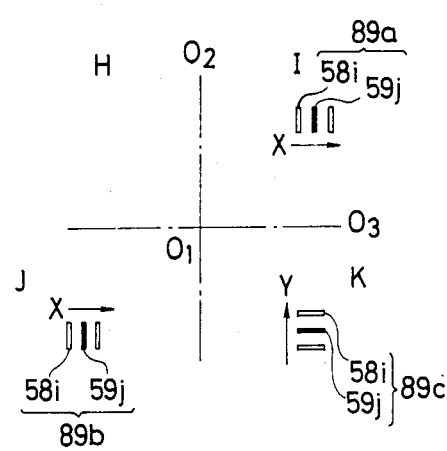
Figure 11C:
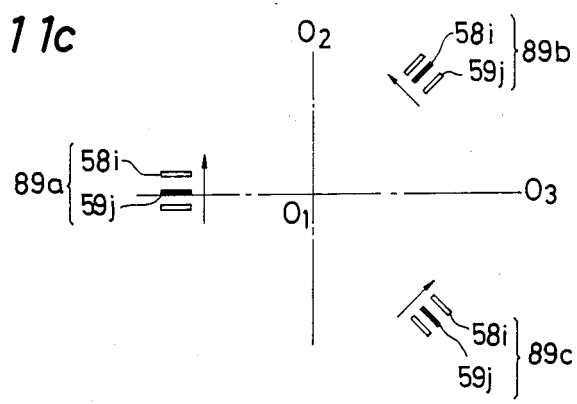

The processing circuit 67 is as has its circuit diagram shown in FIG. 6. Numeral 70 designates a sample-and-hold circuit which, when supplied with a video signal 31 as shown in FIG. 7a from the TV camera 65, samples the signal at fixed intervals at sampling positions $x_1$, $x_2$, ... and $x_n$ and holds the values $y_1$, $y_2$, ... and $y_n$ thereof as shown in FIG. 7b. Shown at numeral 72 is a sampling signal generator, which generates signals for causing the sample-and-hold circuit 70 to sample the video signal. An A/D converter 73 converts into digital signals the analog signals which are held by the sample-and-hold circuit 70. A memory 74 temporarily stores the digital signals $y_1$, $y_2$, ... and $y_n$ which are delivered from the A/D converter 73. Numeral 75 indicates an arithmetic circuit, by which a symmetric relation $Z_i(x_i)$ given by the following equation (3) is evaluated with note taken of ±j-th sampling positions with respect to a symmetry folding-back point $x_i$ as illustrated in FIG. 7b:

$$Z_i(x_i) = \sum_{j=1}^{m} \{y(x_i - j) - y(x_i + j)\}^2 \quad (3)$$

where m denotes a value which is determined to be optimal in consideration of the size of the positioning pattern on the wafer 41 noticed and which is set as indicated in FIG. 7b by way of example. As illustrated in FIG. 7c, the arithmetic circuit 75 evaluates the symmetry functions $Z_i(x_i)$ while changing the symmetry folding-back point $x_i$ to $x_1$, $x_2$, ... and $x_n$ in succession and finds a symmetry folding-back point $x_0$ affording the minimum value of the functions. Accordingly, the TV camera 65 converts the image as shown in FIG. 5b into the video signal 71 shown in FIG. 7a, the sample-and-hold circuit 70 samples the video signal 71 at the fixed intervals and holds the sampled signals, the A/D converter 73 converts the held signals $y_1$, $y_2$, ... and $y_n$ into the digital signals $y_1$, $y_2$, ... and $y_n$, and the arithmetic circuit 75 evaluates using the digital signals $y_1$, $y_2$, ... and $y_n$, each symmetry function $Z_i(x_i)$ indicated by the above equation (3) with note taken of the ±j-th sampling positions reckoned from the symmetry folding-back point $x_i$ as shown in FIG. 7b, the symmetry folding-back point $x_i$ being successively changed as $x_1$, $x_2$, ... and $x_n$ and finds the folding-back point $x_0$ indicative of the minimum value of the evaluated functions $Z_i(x_i)$ as shown in FIG. 7c. This symmetry folding-back point $x_0$ is the position of the best folding-back pattern matching, and indicates the true position of the positioning pattern. Moreover, in the present embodiment, the mask alignment pattern 59 and the wafer alignment pattern 58 can be simultaneously focalized as shown in FIG. 5a, so that a double focus can be realized with the single control system. FIG. 8 is a perspective view showing an apparatus for the relative detection of a plurality of objects which illustrates a practicable example of the present invention. As shown in the figure, an X-table 78 which is supported so as to be freely moved in the direction of an arrow X by an X-axis driving motor 77 is disposed on a base 76, a Y-table 80 which is supported so as to be freely moved in the direction of an arrow Y by a Y-axis driving motor 79 is disposed on the X-table 78, and the wafer 41 shown in FIG. 4a is carried and supported on the Y-table 80. In addition, a bed 82 is fixed above the wafer 41 by a plurality of legs 81, and the mask 43 is fixed to the position of the bed 82 over the wafer 41. Besides, the three sets of illuminating optical systems 48 and the three sets of detecting optical systems 60 are radiately disposed around the mask 43 on the bed 82, and an Xe lamp house 83 is disposed which is supported at a position separate from the bed 82 so as to be connected with the three sets of illuminating optical systems 48 through the fibers 50a respectively. Owing to the above arrangement, the three sets of illuminating optical systems 48 simultaneously illuminate the mask 43 and the wafer 41 through the three fibers 50a from the Xe lamp house 83, and the three sets of detecting optical systems 60 are simultaneously driven to simultaneously detect the misalignment magnitudes between the wafer 41 and the mask 43 in the directions X, Y and θ. The X-table 78 and the Y-table 80 are moved in correspondence with the misalignment magnitudes, to perform the alignment between the wafer 41 and the mask 43. FIG. 9 is a perspective view in which the illuminating optical system 48 and the detecting optical system 60 shown in FIG. 8 are illustrated on enlarged scale. As illustrated in the figure, the illuminating optical system 48 and the detecting optical system 60 are carried and supported on an identical table 84. This table 84 is supported on a rest 86 so as to be freely moved radially of the mask 43 by a driving motor 85 as shown in FIG. 8, and the rest 86 is fixed and supported on the bed 82 shown in FIG. 8. Owing to the above arrangement, the illuminating optical system 48 and the detecting optical system 60 can simultaneously move in the radial direction of the mask 43. Accordingly, they can be positioned to any of alignment patterns 87 for a multiplicity of steps existent on the streets 46 formed in the chip 45 on the mask 43, in accordance with a pertinent step. Moreover, the positioning according to a step can be performed even when the size of the chip 45 changes, FIGS. 10a thru 10f show examples of detection patterns. FIG. 10a corresponds to a case where a straight line-shaped mask alignment pattern 59a parallel to an optic axis plane 88 is arranged on the optic axis plane and where two straight line-shaped wafer alignment patterns 58a are symmetrically arranged on both the sides of the pattern 59a; FIG. 10b a case where a dotted line-shaped mask alignment pattern 59b parallel to an optic axis plane 88 is arranged on the optic axis plane and where two dotted line-shaped wafer alignment patterns 58b are symmetrically arranged on both the sides of the pattern 59b; FIG. 10c a case where a straight line-shaped mask alignment pattern 59c is arranged on an optic axis plane 88 and in parallel therewith and where two wafer alignment patterns 58c and two mask alignment patterns 59c in the shapes of straight lines are symmetrically arranged on both the sides of the pattern 59c and with respectively equal intervals therefrom; FIG. 10d a case where a straight line-shaped wafer alignment pattern 58d is arranged on an optic axis plane 88 and in parallel therewith, where two straight line-shaped wafer alignment patterns 58e are symmetrically arranged on both the sides of the pattern 58d and where three mask alignment patterns 59e and 59f whose sizes in the lengthwise direction of the optic axis plane 88 are smaller are arranged at the central parts of the three wafer alignment patterns 58d and 58e; FIG. 10e a case where wafer alignment patterns 58f and 58g and mask alignment patterns 59g and 59h in the shapes of straight lines are arranged on an optic axis plane 88 and in parallel therewith; and FIG. 10f a case where a straight line-shaped mask alignment pattern 59i is arranged on an optic axis plane 88 and in parallel therewith and where two slant wafer alignment patterns 58h are arranged on both the sides of the pattern 59i and symmetrically to the optic axis plane 88. As understood from these figures, in the present invention, the alignment can be detected subject to the symmetry with respect to a plane parallel to the optic axis plane 88 (a plane perpendicular to the sheet of the figures). The optic axis plane 88 may well move in parallel within the corresponding figure. The reason is that, since the present invention detects positions in a direction inclining to alignment planes as stated before, any plane other than the plane parallel to the optic axis plane 88 becomes asymmetric and cannot have its alignment detected at high precision. Each of FIGS. 11a thru 11c is a diagram showing the directions of detecting three sets of alignment patterns 89a, 89b and 89c each of which consists of one mask alignment pattern 59j arranged centrally and two wafer alignment patterns 58i arranged symmetrically on both the sides thereof. More specifically, FIG. 11a corresponds to a case where one set of alignment patterns 89a is arranged on a center line $O_2$ in a Y-direction passing through the central point $O_1$ between the wafer 41 and the mask 43, in such a manner that the mask alignment pattern 59j and the two wafer alignment patterns 58i are arrayed in an X-direction, and where each of the other two sets of alignment patterns 89b and 89c is arranged on a center line $O_3$ in the X-direction in such a manner that the single mask alignment pattern 59j and the two wafer alignment patterns 58i are arrayed in the Y-direction at either of positions equally distant from the central point $O_1$. FIG. 11b corresponds to a case where the alignment patterns 89a, 89b and 89c are respectively arranged in three planes I, J and K among four planes H, I, J and K partitioned by an X-directional center line $O_3$ and a Y-directional center line $O_2$ which pass through the central point $O_1$ between the wafer 41 and the mask 43, in such a manner that in each of the alignment patterns 89a and 89b respectively arranged in the planes I and J, the single mask alignment pattern 59j and the two wafer alignment patterns 58i are arrayed in the X-direction, while in the single alignment pattern 89c arranged in the plane K, the single mask alignment pattern 59j and the two wafer alignment patterns 58i are arrayed in the Y-direction. FIG. 11c corresponds to a case where the three sets of alignment patterns 89a, 89b and 89c are arranged radially around the central point $O_1$, and where in one 89a of the three sets of alignment patterns, the single mask alignment pattern 59j and the two wafer alignment patterns 58i are arrayed in a Y-direction, while in each of the remaining two sets of alignment patterns 89b and 89c, the single mask alignment pattern 59i and the two wafer alignment patterns 58i are arrayed in oblique directions. In brief, the detected values of three degrees of freedom may be obtained by the use of the three sets of alignment patterns. Besides, in a case where in the positioning of the wafer and the mask, the inclination angles $\theta$ of the detecting optic axes 68 with respect to the vertical line 55 shown in FIG. 5a agree, the detected values of two degrees of freedom (X, Y) may be obtained. Further, in a case where the optic axes of the respective illuminating optical systems and those of the detecting optical systems are symmetrically arranged, the detection can be performed with a dark field of view or illumination from the objectives or a combination thereof. Although the X-ray is used as the projection light in the embodiment, this is not restrictive but a particle ray or white light can be used. In addition, the alignment patterns need not be especially provided as such, images formed at positions near the wafer and the mask can be used. The objective should desirably have an NA of or below 0.4 in design, and the inclination angle of the detecting optic axis should desirably be 70° or less.

Since the present invention is as stated above, it has effects as described below. First, let's consider a case of detecting alignment patterns in or near a projection region. In the method as in the prior art wherein an optical system is moved each time one projection region is aligned, a movement precision of submicron order is required. In addition, since at least about 2 seconds are needed for moving the optical system in the limited space between a mask plane and a projection light source, about 4 seconds are necessary for setting and withdrawing the optical system. The steps of projection, detection, positioning and movement requiring about 4 seconds are repeated for individual wafers, so that a considerable period of time is needed. In contrast, the present invention need not move an optical system and can therefore enhance the throughput. Besides, since projection can be executed immediately after alignment or the alignment can be executed during the projection, a precision degradation (about 0.05 μm) attributed to a time delay (about 2 seconds) from the end of the alignment till the projection can be prevented. Further, in order to move the optical system every projection region as in the prior art, a mechanism for the movement is necessitated to involve a complicated arrangement. Moreover, with the movement, the components, e.g., lenses of the optical system move to degrade the precision. In contrast, the present invention does not move the optical system, so that the arrangement is simplified and that the precision can be enhanced.

Next, in case of detecting alignment patterns distant from a projection region, the projection region and a detection position can be brought to an identical position or close positions, so that an alignment error attributed to dimensional errors (~0.05 μm) depending upon the places of a mask and a wafer can be prevented. Besides, the available percentage of chips in the peripheral edge of the wafer can be enhanced.

Next, a third embodiment according to the present invention will be described with reference to FIGS. 12 thru 17.

Figure 12:
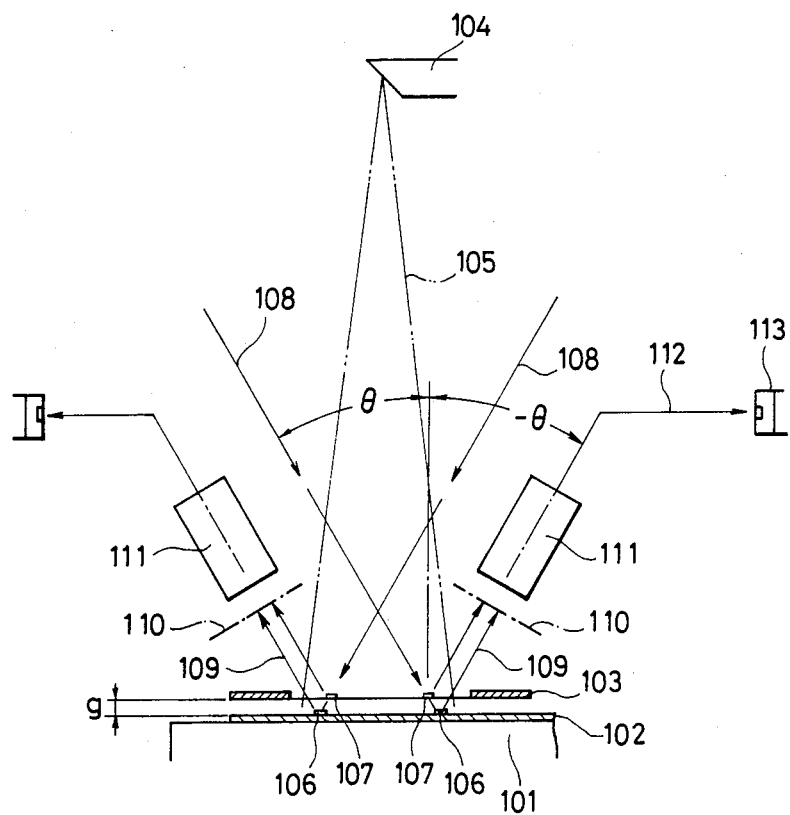
FIG. 12 is an arrangement view for explaining a third embodiment of the present invention.

FIG. 12 shows the outline of the general arrangement of the third embodiment of the present invention. While the relative positions of a mask and a wafer are detected in the directions of a $Y_1$-axis, a $Y_2$-axis and an X-axis by respective optical systems of the three axes, those of the optical systems for detecting the $Y_1$-axial and $Y_2$-axial positions are shown in FIG. 12.

A wafer 102 drawn to a wafer chuck 101 by suction confronts a mask 103 with a minute gap g (5-40 μm) therebetween. An X-ray source 104 which is a projection light source is arranged on a perpendicular passing through the center of a mask surface, and an X-ray 105 is radiately thrown therefrom to transfer a circuit pattern on the mask 103 onto the surface of the wafer 102. The surfaces of the wafer 102 and the mask 103 are respectively provided with alignment marks 106 and 107 of Fresnel zones having shapes to be described later. When the Fresnel zone marks 106 and 107 are illuminated with coherent light 108 (He-Ne laser) in an oblique direction of angle $\theta$ from within a projection region toward the exterior of the projection region as indicated by arrows, coherent light 109 diffracted (reflected) by the Fresnel zones proceeds externally of the projection region at an angle of $-\theta$ and forms a focus 110. In order to detect the focus, an objective 111 is arranged inclining by $-\theta$.

Since the objective 111 inclines in this manner, it does not interfere with the X-ray 105 being the projection light. It is therefore dispensed with to withdraw the objective 111 after the alignment of the mask and the wafer.

The focus of the diffracted light detected by the objective 111 passes an optical path 112 and is focused on a sensor 113 again, and the position thereof is detected by the sensor 113.

The shapes of the Fresnel zone marks to be provided on the wafer 102 and the mask 103 will be described with reference to FIGS. 13a thru 13d.

Figure 13A:
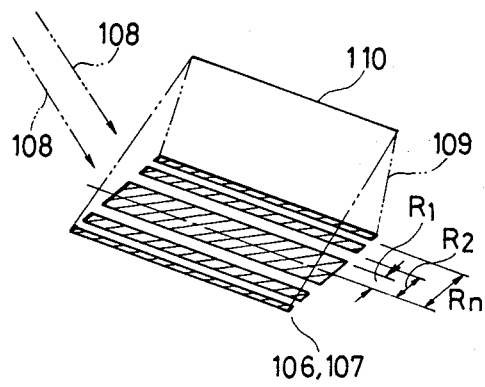
FIGS. 13a and 13b are explanatory views for elucidating conventional unidimensional Fresnel zone marks.
Figure 13B:
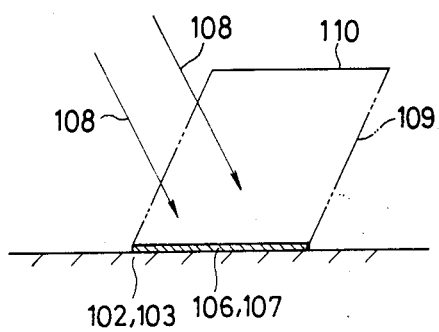

FIGS. 13a and 13b show unidimensional Fresnel zone marks 106 and 107 the respective patterns of which are arranged in parallel.

When these Fresnel zone marks 106 and 107 are illuminated with coherent light 108 in an oblique direction as indicated by arrows, the position of a focus 110 of diffracted (reflected) light 109 from the Fresnel zone marks 106 and 107 can be made parallel to the plane of the wafer 102 or mask 103 provided with the Fresnel zones 106 or 107 because a focal distance f is determined by the pattern size Rn of the Fresnel zones 106 and 107 as expressed by the following formula:

$$f = Rn^2/n\lambda$$

n: order,
80 : wavelength of coherent light,
Rn: pattern size of Fresnel zones,
f: focal distance.

Figure 13C:
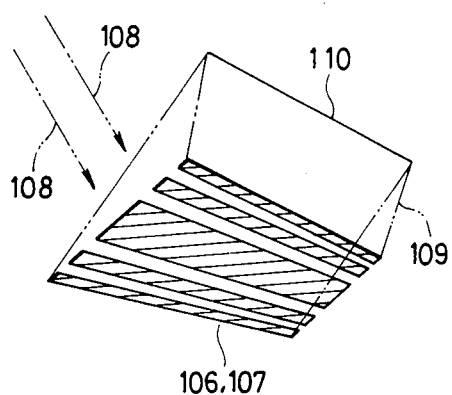
FIGS. 13c and 13d are explanatory views for elucidating unidimensional Fresnel zone marks which are used in the third embodiment of the present invention.
Figure 13D:
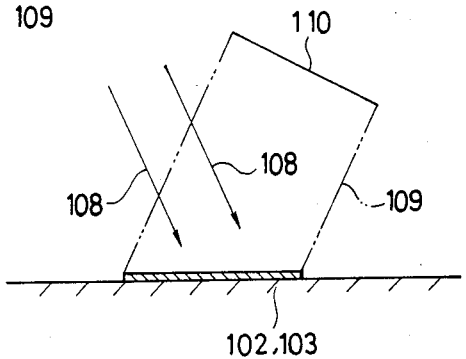

When the focal plane 110 of the diffracted light of the Fresnel zones 106 and 107 is detected by the objective inclined as illustrated in FIG. 12, only one point thereof agrees with the focus of the objective and the other part thereof is defocused. Therefore, wedge-shaped Fresnel zone marks 106 and 107 the respective patterns of which are taperingly arranged as shown in FIG. 13c are provided. The focal distance f is determined by the pattern size Rn as stated above, and shortens as Rn becomes smaller. By properly determining the pattern size Rn, therefore, the focal plane 110 is formed aslant to the wafer 102 and mask 103 provided with the Fresnel zones 106 and 107 as shown in FIG. 13d and in a plane perpendicular to the optic axis of the objective 111 shown in FIG. 12. Thus, the defocusing can be prevented.

Figure 14A:
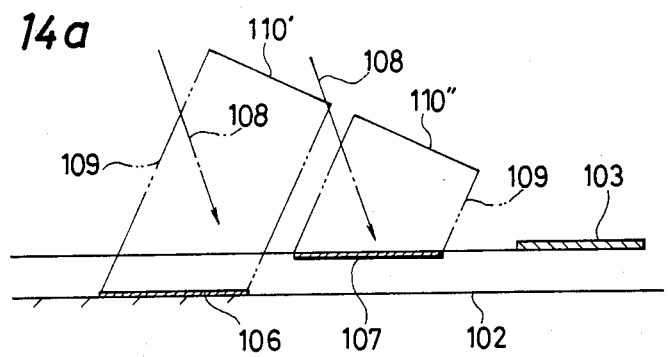
FIGS. 14a–14c are explanatory views for elucidating the focal position relationship of Fresnel zones arranged on a a wafer and a mask in the present embodiment.

FIG. 14a shows an example in which the Fresnel zone marks 106 and 107 illustrated in FIGS. 13c and 13d are provided on the wafer 102 and the mask 103. The pattern sizes Rn of the respective Fresnel zone marks 106 and 107 are determined so that the focus 110' of the diffracted light 109 from the Fresnel zone mark 106 of the wafer 102 and the focus 110" of the diffracted light 109 from the Fresnel zone mark 107 of the mask 103 may be formed on an identical plane perpendicular to the optic axis of the objective 111 shown in FIG. 12.

Figure 14B:
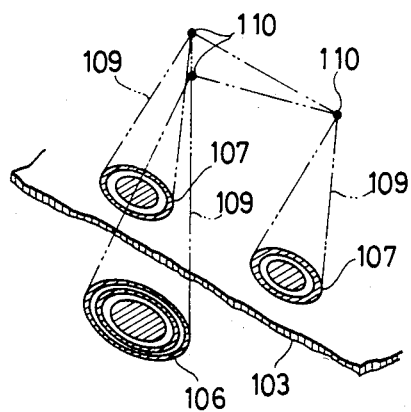
Figure 14C:
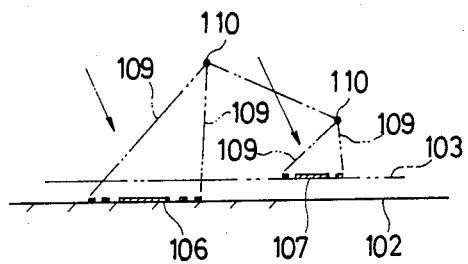

FIGS. 14b and 14c show a method employing two-dimensional (circular) Fresnel zone marks 106 and 107. This method is similar to the case shown in FIG. 14a. Since, however, the two-dimensional (circular) Fresnel zones 106 and 107 form focuses 110 in the shape of dots, the sensor 113 shown in FIG. 12 needs to be an areal sensor, and unfavorably a detecting software algorithm becomes complicated.

Figure 15A:
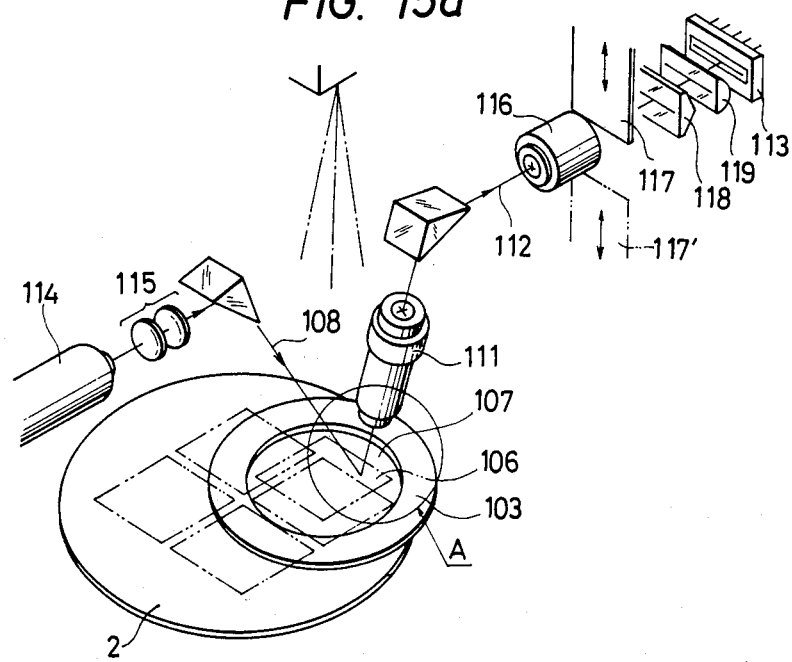
FIGS. 15a and 15b are arrangement views for explaining an apparatus to which the third embodiment of the present invention is applied.
Figure 15B:
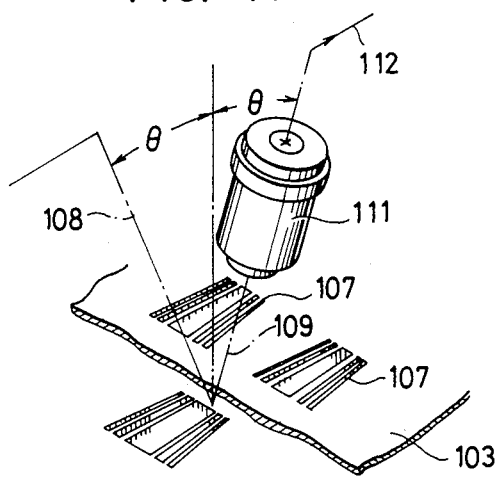
Figure 16A:
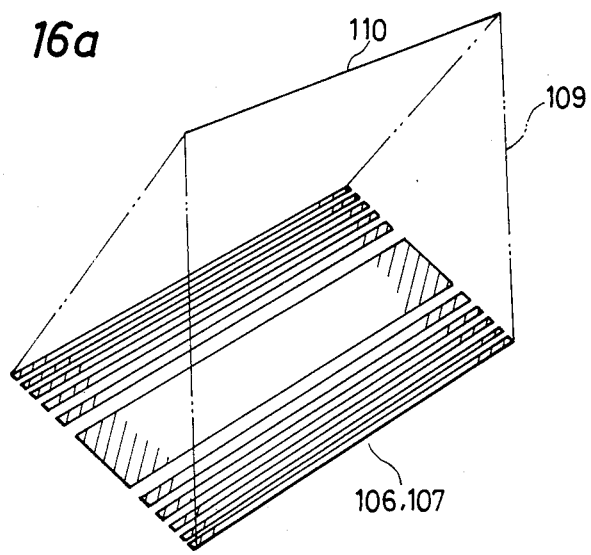
FIGS. 16a and 16b are solid views for explaining a modification of wedge-shaped Fresnel zones.
Figure 16B:
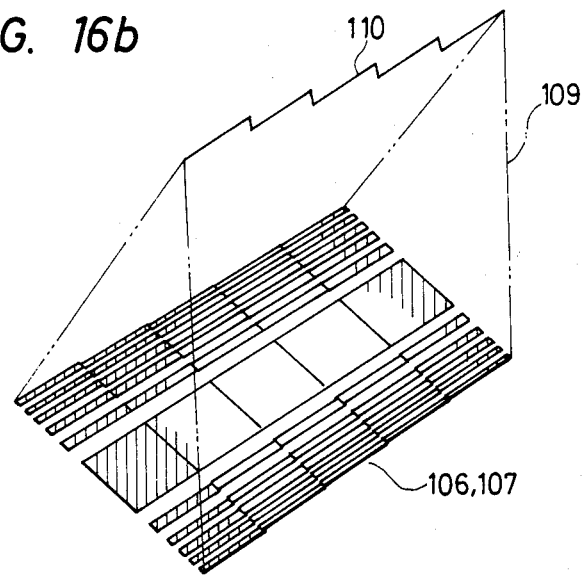

FIGS. 15a and 15b show a practicable example of an apparatus to which the third embodiment according to the present invention is applied. A He-Ne laser beam 108 from a laser oscillator 114 is thrown on a mask 103 and a wafer 102 through a collimating lens 115. Diffracted (reflected) light from Fresnel zone marks 106 and 107 on the wafer 102 and the mask 103 is focused and is detected by an objective 111, and the detected focus is further magnified by a second objective 116. Subsequently, the magnified focus passes through a prism 118 for combining the detected image of the wafer 102 and that of the mask 103 and then through a cylindrical lens 119 for enhancing the intensity of a detection signal, whereupon the focus 110 of the diffracted light is formed on a linear sensor 113 again. Owing to shutters 117' and 117", only the detected image of the wafer 102 or only the detected image of the mask 103 can be focused on the linear sensor 113. Wedge-shaped Fresnel zones shown in FIG. 16a are difficult of fabrication, and stepped patterns shown in FIG. 16b can be substituted therefor.

Figure 17:
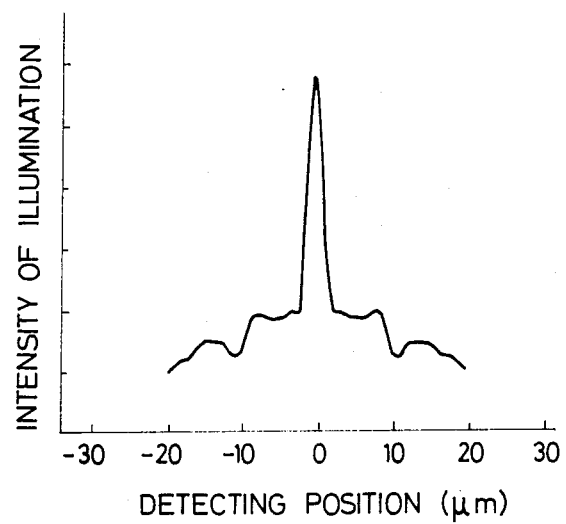
FIG. 17 is a diagram showing the signal intensity distribution of unidimensional Fresnel zones.

FIG. 17 shows the distribution of the signal intensities of the Fresnel zone marks 106 and 107 which can be detected by the optical system depicted in FIG. 15a.

According to the present invention, an objective need not be withdrawn at the end of alignment, so that the alignment can be performed at high speed, and vibrations during the withdrawal are not involved, so that an alignment precision once established is not lowered.

The focal positions of wedge-shaped Fresnel zone marks provided on a wafer and a mask can be formed on an identical plane perpendicular to the optic axis of an objective, and by detecting these focal positions, a sharp detection image with the mask and the wafer cofocused is obtained, and a high alignment precision can be achieved.

Accordingly, the invention is a technique indispensable to X-ray projection aligners of the step-and-repeat system.

We claim:

1. An alignment method comprising the steps of:

providing a mask having a plurality of symmetrical formations of alignment patterns including linear segments formed in a peripheral portion of the mask, and a wafer having a plurality of symmetrical formations of alignment patterns including linear segments extending in a direction of the alignment patterns of the mask;

illuminating both the mask alignment patterns and the wafer alignment patterns through an area of the mask alignment patterns along a direction inclined to an alignment direction plane utilizing each of a plurality of illumination optical systems arranged so as to not interefere with an exposure light beam, the illumination optical systems having an illumination optical axis inclined with respect to the alignment direction plane extending perpendicularly with respect to a symmetrical center line direction of the alignment patterns;

focusing reflected images from both the mask alignment patterns and the peripheral alignment patterns on a detector surface of a respective image detector of each of a plurality of alignment pattern magnifying optical systems including an object lens and arranged so as to not interfere with an exposure light beam, the alignment pattern magnifying optical systems having a detection optical axis inclined with respect to the alignment direction plane and the object lenses having a small NA (Numerical Aperture);

transforming each of the focused reflected images into image signals;

converting each of the image signals into digital signals utilizing A/D conversion and storing the digital signals in a memory;

reading out the digital signals from the memory for determining the center of the mask alignment patterns and the wafer alignment patterns;

detecting a relative displacement between the mask and wafer from each of the centers of the mask alignment patterns and the wafer alignment patterns; and aligning the mask and wafer by moving at least one of the mask and wafer so that displacement therebetween does not exist.

2. A method according to claim 1, wherein the object lens of the magnifying optical systems is provided with an NA no greater than 0.4.

3. A method according to claim 1, wherein the angle of inclination of the detection optical axis with respect to the alignment direction plane is no greater than 70°.

4. An alignment apparatus comprising:

mask chuck means for holding a mask having a plurality of symmetrical formations of alignment patterns thereon, the alignment patterns including linear segments formed in a peripheral portion of the mask;

wafer stage means mounted on a wafer chuck for holding a wafer having a plurality of symmetrical formations of alignment patterns thereon, the alignment patterns including linear segments extending in a direction of the alignment patterns of the mask, the wafer being arranged in opposition to the mask with a gap therebetween;

a plurality of illumination optical systems for illuminating both the mask alignment patterns and the wafer alignment patterns through an area of the mask alignment patterns along a direction of the illumination optical axis inclined with respect to an alignment direction plane extending perpendicular to a symmetrical center line direction of the alignment patterns, the illumination optical systems being arranged so as to not interfere with an exposure light beam;

a plurality of alignment pattern magnifying optical systems including respective image detectors and object lenses, the alignment pattern magnifying optical systems focusing reflected images from the mask alignment patterns and the wafer alignment patterns on respective detector surfaces of the image detectors along a detection optical axis inclined with respect to the alignment direction plane, the alignment pattern magnifying optical systems including the object lenses thereof being arranged so as to not interefere with the exposure light beam, the object lenses having a small NA (Numerical Aperture), the image detectors transforming the focused images into focused image signals;

A/D conversion circuit means for converting each of the focused image signals into digital signals;

memory means for storing the digital signals;

arithmetic means responsive to the digital signals for determining each of the centers of the mask alignment patterns and the wafer alignment patterns; and means for detecting a relative displacement between the mask and wafer in accordance with the determined centers of the mask alignment patterns and the wafer alignment patterns and for aligning the mask and wafer by moving at least one of the mask and the wafer so that displacement therebetween does not exist.

5. An apparatus according to claim 4, wherein the arithmetic means includes means for processing symmetric relations for each of the digital signals in each of the focused mask alignment patterns and each of the focused wafer alignment patterns so as to determine each of the centers of the mask alignment patterns and the wafer alignment patterns indicative of minimum values of the symmetric relations.

6. An apparatus according to claim 4, further comprising a plurality of tables for mounting each of the illuminating optical systems and each of the alignment pattern magnifying optical systems arranged for movement radially of the mask.

7. An apparatus according to claim 4, wherein the illuminating optical systems and the alignment patterns magnifying optical systems are arranged at opposite angles with respect to the alignment direction plane.

* * * * *